United States Patent [19]

Kembo et al.

[11] Patent Number: 4,803,712
[45] Date of Patent: Feb. 7, 1989

[54] X-RAY EXPOSURE SYSTEM

[75] Inventors: Yukio Kembo; Minoru Ikeda, both of Yokohama; Motoya Taniguchi, Kamakura, all of Japan

[73] Assignee: Hitachi, Ltd., Tokyo, Japan

[21] Appl. No.: 4,880

[22] Filed: Jan. 20, 1987

[51] Int. Cl.$^4$ .............................................. G03F 9/00
[52] U.S. Cl. .................................. 378/034; 250/492.2
[58] Field of Search ................. 378/34, 35; 250/492.2, 250/491.1; 364/559

[56] References Cited

U.S. PATENT DOCUMENTS

| | | | |
|---|---|---|---|
| 4,403,336 | 9/1983 | Taniguchi et al. | 378/35 |
| 4,514,858 | 4/1985 | Novak | 378/34 |
| 4,644,576 | 2/1987 | Kuyel | 378/34 |

Primary Examiner—Craig E. Church
Assistant Examiner—T. N. Grigsby
Attorney, Agent, or Firm—Antonelli, Terry & Wands

[57] ABSTRACT

An X-ray exposure system includes a frame set on the floor; an X-ray source fixedly provided in the central portion of the upper part of the frame; a mask-wafer alignment means comprising a wafer at a fixed distance from a mask, an X-Y table mounted with the wafer holder, a mask holder for holding the mask, and an alignment detecting means for detecting the alignment of the alignment pattern of the mask and that of the wafer; vibration isolators for supporting the mask-wafer alignment means so that vibrations do not propagate to the mask-wafer alignment means; detecting means for detecting the position of the mask-wafer alignment means with respect to three-dimensional directions relative to the X-ray source; an arithmetic means for calculating an exposure error of a dislocation of a mask pattern exposure on the wafer, on the basis of position data obtained by the detecting means; and correcting means for correcting the exposure error calculated by the arithmetic means.

25 Claims, 4 Drawing Sheets

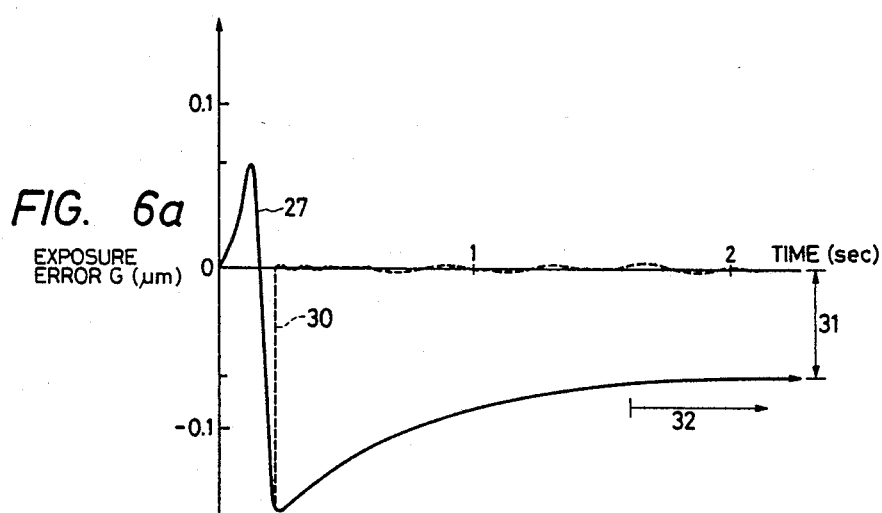

X-RAY EXPOSURE SYSTEM

BACKGROUND OF THE INVENTION

The present invention relates to an X-ray exposure system and, more particularly, to an X-ray exposure system effective for proximity exposure in which a mask circuit pattern and a wafer circuit pattern are aligned at a high accuracy and the mask circuit pattern is exposed on the wafer, or for projective exposure.

An X-ray exposure system of such a kind as illustrated in FIG. 1 is disclosed in Japanese patent publication No. 53-34466 and in S. Yamazaki et al., "Development of a High-precision X-ray Exposure System", Seimitsu Kikai, Vol. 46, No. 4, PP. 79–84 (1980).

As illustrated in FIG. 1, the known X-ray exposure system comprises a frame 2 placed on the floor with vibration isolators 11 therebetween, an X-ray source 3 fixedly mounted on the frame 2, a mask alignment system 9 for aligning a mask 6 and a wafer 7, and a bed 10 supporting the mask alignment system 9 thereon and placed on the floor with vibration isolators 11 therebetween.

The X-ray source 3 radiates X-rays from a fixed X-ray generating point on a rotary cathode 4 onto the mask 6 to expose a mask circuit pattern on the wafer.

The mask alignment system 9 is mounted on the bed 10 and the bed 10 is supported on the vibration isolators 11 so that vibration will not be transmitted from the floor to the mask alignment system 9 and vibration of the rotary cathode 4 of the X-ray source 3 will not be propagated to the mask alignment system 9.

However, this known X-ray exposure system takes no notice of the relative dislocation between the X-ray source and the mask alignment system attributable to the positional instability of the bed due to the vibration of the vibration isolators 11.

SUMMARY OF THE INVENTION

Accordingly, it is an object of the present invention to provide an X-ray exposure system capable of preventing the relative dislocation between the X-ray source, and the mask and the wafer attributable to the vibration of the vibration isolators and the neutral zone so that the pattern exposure error is reduced.

To achieve the object of the invention, the present invention provides an X-ray exposure system comprising a frame attached to the floor, an X-ray source fixed to the upper part of the frame in the central portion of the same, a mask-wafer alignment system for aligning a mask and a wafer, a mask-wafer alignment system supporting base for fixedly supporting the mask-wafer alignment system, vibration isolators supporting the mask-wafer alignment system supporting base so that vibration does not propagate to the mask-wafer alignment system supporting base, detecting means for detecting the three-dimensional position, namely, the position represented at the directions of three axes, of the mask-wafer alignment system relative to the frame, arithmetic means for computing the dislocation of the exposure position of a mask circuit pattern relative to a wafer on the basis of the three-dimensional position of the mask-wafer alignment system relative to the frame, and correcting means for correcting the dislocation obtained by the arithmetic means through computation. When the mask-wafer alignment system is inclined relative to th X-rays radiated by the X-ray source due to the movement of the vibration isolators, the mask and the wafer are aligned automatically at a high accuracy, so that the mask pattern is exposed (transferred) to the wafer at a correct position without exception.

In one aspect of the present invention, the X-ray source and the mask-wafer alignment system are interconnected by an at least partly flexible hermetic structure to seal an X-ray attenuation preventing gas, such as He-gas, therein. Thus, the attenuation of the X-ray is prevented and the mask pattern transferring operation is carried out at a high accuracy and at a high throughout.

In another aspect of the present invention, vibration isolators are provided between the X-ray source and the mask-wafer alighnment system, and the center of swing motion of the mask-wafer alignment system relative to the X-ray source is located so as to substantially coincide with the X-ray generating point so that the mask pattern is exposed correctly to the wafer.

BRIEF DESCRIPTION OF THE DRAWINGS

FIG. 6a is a graph showing the variation of exposure error with time;

FIG. 6b is a time chart of the X-ray exposure operation; and

FIG. 6c is a time chart of the exposure error.

DETAILED DESCRIPTION OF THE PREFERRED EMBODIMENTS

Figure 2:
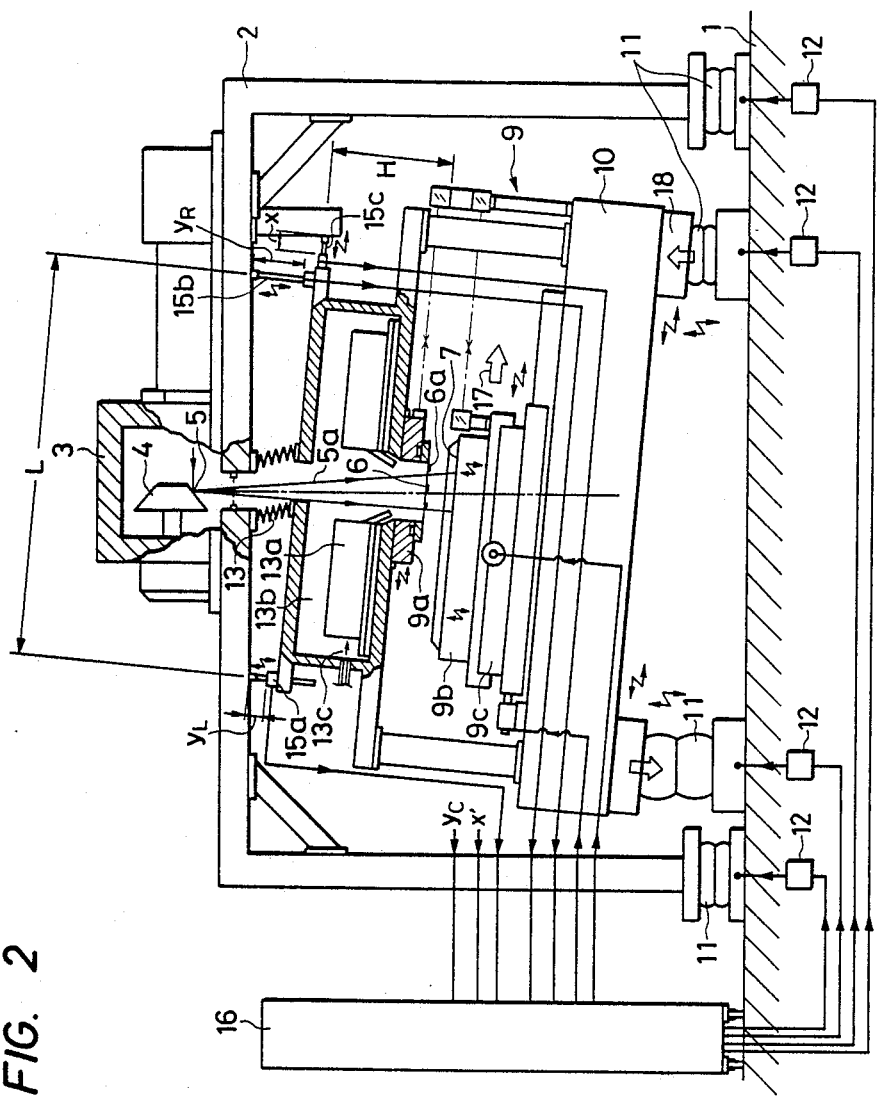
FIG. 2 is a partly sectional front elevation of an X-ray exposure system, in a first embodiment, according to the present invention.

Preferred embodiments of the present invention will be described hereinafter with reference to the accompanying drawings. Referring to FIG. 2, an X-ray exposure system, in a first embodiment, according to the present invention comprises: a frame 2 placed on the floor 1 with vibration isolators 11 therebetween; an X-ray source 3 fixed to the frame 2; a mask-wafer alignment system 9 for aligning a mask and a wafer 7; a mask-wafer alignment system supporting base 10; vibration isolators 11, such as pneumatic cushions, each having a valve unit 12; position detectors 15a, 15b and 15c for detecting the position of the mask-wafer alignment system 9 relative to the X-ray source 3; and a controller 16 which computes the dislocation of the mask-wafer alignment system 9 relative to the X-ray source 3, and corrects the dislocation.

The X-ray source 3 radiates X-rays from an X-ray generating point 5 on the rotary cathode 4 thereof on the mask 6 to transfer a mask circuit pattern 6a to the wafer 7.

The construction of the X-ray source 3 is described concretly in, for example, U.S. Pat. No. 4,566,116. The X-ray source 3 may be a plasma type X-ray source, for example, a laser plasma type X-ray source or a plasma focus X-ray source, or an X-ray source of a large size as compared with the mask-wafer alignment system 9, such as a synchrotron orbital radiation X-ray source.

The vibration isolator 11 will be described hereinafter with reference to FIG. 3. Since the vibration isolators 11 supporting the base 10 are substantially the same in construction as those supporting the frame 2, only the vibration isolator 11 supporting the frame 2 will be described.

Figure 1:
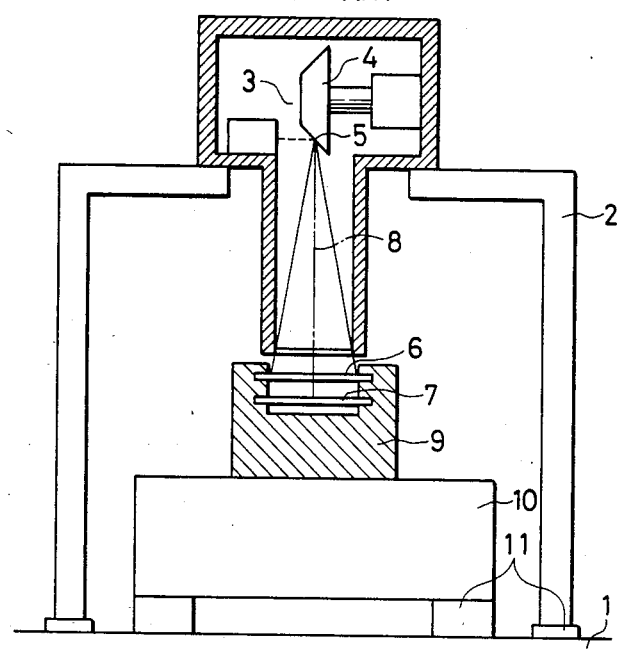
FIG. 1 is a partly sectional front elevation of a conventional X-ray exposure system.
Figure 3:
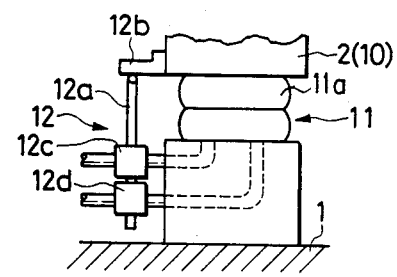
FIG. 3 is an enlarged fragmentary view of the vibration isolator employed in the X-ray exposure system of FIG. 2.

Referring to FIG. 3, the vibration isolator 11 has a sensor 12a which is in contact with a lever 12b fixed to the frame 2 and associated with an air supply valve 12c and an air discharge valve 12d. When the frame 2 is moved up relative to the vibration isolator 11 above a predetermined position, the sensor bar 12a moves up following the lever 12b; consequently, the discharge valve 12d is opened to discharge air from an air pillow 11a, so that the frame 2 is lowered. On the contrary, when the frame 2 is moved down relative to the vibration isolator 11 below the predetermined position, the sensor bar 12a is depressed by the lever 1b; consequently, the air supply valve 12c is opened to supply air into the air pillow 11a, so that the frame 2 is raised.

The vibration isolator 11, an air servo vibration isolator, has a neutral zone of several millimeters between the air supply starting position and the air discharge starting position to prevent the unnecessarily air supply and vibrations attributable to the air discharge. Since the air pillow 11a is not restrained from transverse motion, the position of the frame 2 with respect to transverse directions is indefinite, and hence the frame 2 is movable in transverse directions within a range of several millimeters. Most vibration isolators, such as the above-mentioned controllable pneumatic cushion, are indefinite in position with respect to vertical and horizontal directions. Few uncontrollable vibration isolators, such as rubber vibration isolators, can not settle at a position in the range of ±0.1 mm about a definite position in a satisfactorily short time of about 0.1 sec.

The mask-wafer alignment system 9 has a mask holder 9a, a wafer holder 9b, which is similar to those disclosed in U.S. Pat. No. 4,475,223 and 4,504,045, capable of holding a wafer at a fine constant distance along the mask region from a mask held by the mask holder 9a, and a rotary-X-Y table 9c. A mask 6 having an exposure pattern 6a to be transferred to a wafer 7 held on the wafer holder 9b is fixed to the mask holder 9a. The mask-wafer alignment system 9 is mounted on the base 10. The vibration isolators 11 are put between the base 10 and the floor 1 to suppress the transmission of vibration from the floor 1 to the base 10 and to prevent the dislocation of the mask-wafer alignment system 9 by the vibration generated by the X-ray source 3.

The X-ray source 3 and the mask-wafer alignment system 9 are interconnected by a vibration absorbing device 13, such as a bellows, so that the vibration of the X-ray source 3 will not be propagated to the mask-wafer alignment system 9. As disclosed in U.S. Pat. No. 4,492,356, the vibration absorbing device 13 has an airtight construction hermetically sealing an exposure chamber 13b accommodating an alignment optical system 13a. A gas having a low X-ray absorbance, such as He-gas 13c is sealed in the vibration absorbing devie 13, so that the mask 6 is irradiated stably by X-rays at a high intensity even when the mask-wafer alignment system 9 is dislocated relative to the X-ray source 3.

The mask-wafer alignment system 9 aligns the mask 6 and the wafer 7 in the direction of X-axis and Y-axis and rotation. In aligning the mask 6 and the wafer 7, the respective alignment patterns of the mask 6 and the wafer 7 are detected optically by the alignment optical system 13a, and then the rotary-X-Y table is adjusted minutely with respect to the X-direction, the Y-direction and the angular position to superpose the mask alignment pattern and the wafer alignment pattern for aligning the mask 6 and the wafer 7. Normally, the mask table 9a of the mask-wafer alignment system 9 also is an X-Y table capable of being moved minutely in the X-direction and the Y-direction and hence the mask 6 may be adjusted minutely for aligning. The mask table 9a and the alignment optical system 13a are provided on a mask bed which is supported on the base 10.

The position detectors 15a, 15b and 15c are fixed to the mask-wafer alignment system 9 with the respective detecting members thereof in abutment with the frame 2 mounted with the X-ray source 3 to detect the position of the mask-wafer alignment system 9 respective to the X-ray source 3. The detection signals of the position detectors 15a, 15b and 15c are given to the controller 16.

The controller 16 is capable of calculating the dislocation of the mask-wafer alignment system 9 relative to the X-ray source 3 on the basis of the detection signals by using Expressions (1) to (5), which will be explained afterward, to determine an exposure error G or the dislocation G of the exposure pattern projected on the wafer, namely, the deviation of the mask pattern 6a from the correct position on the wafer 7, and correcting the exposure error G by feeding back the exposure error G to the mask-wafer alignment system 9 to adjust the rotary-X-Y table 9c mounted on the base 10, for example, in a direction indicated by an arrow 17.

Figure 4:
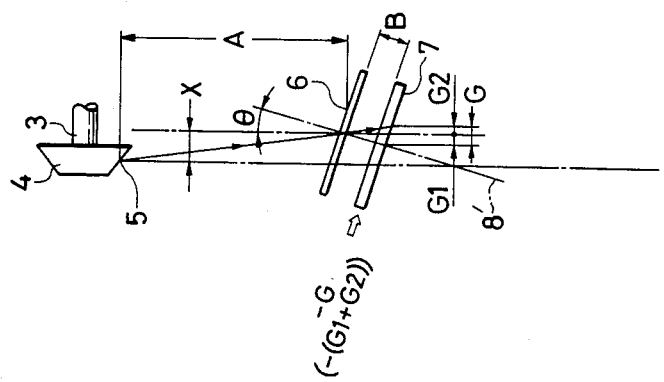
FIG. 4 is a diagrammatic illustration of assistance in explaining the error of exposure of a mask pattern to a wafer attributable to the dislocation of the mask-wafer alignment system relative to the X-ray source.

Procedure of correcting the exposure error G will be described hereinafter with reference to FIG. 4. In FIG. 4, indicated at 8 is a perpendicular to the respective surfaces of the mask 6 and the wafer 7.

The position detectors 15a, 15b and 15c give detection signals representing the position of the mask-wafer alignment system 9 relative to the frame 2 fixedly mounted with the X-ray source 3 to the controller 16. The controller 16 calculates the dislocation of the mask-wafer alignment system 9 relative to the X-ray source 3 on the basis of the detection signals and determines the transfer error G.

Suppose that the mask 6 and the wafer 7 are inclined at an inclination $\theta$ to a horizontal direction and is dislocated by a distance X in the horizontal direction relative to the X-ray source as illustrated in FIG. 4. Then, the exposure error G is expressed by $$G = G1 + G2 \tag{1}$$

where G1 is an error attributable to the inclination $\theta$, and G2 is an error attributable to the horizontal dislocation.

The errors G1 and G2 are expressed by $$G1 = B \cdot \tan \theta \tag{2}$$

$$G2 = B \cdot X/A \tag{3}$$

where A is the distance between the X-ray generating point 5 of the X-ray source and the mask pattern, and B is the distance between the mask pattern and the surface of the wafer 7. The values of X and $\theta$ are determined from the respective lengths of projection yL, Yk and x of the position detectors 15a, 15b and 15c, the distance L between the position detectors 15a and 15b, and distance H between the position detector 15c and the mask 6 by using the following expressions:

$$\theta = \cos^{-1}\{(yk-yL)/L\} \quad (4)$$

$$X = x - H\cdot\tan\theta \quad (5)$$

If A=300 mm, B=15 μm, X=1 mm, and θ=5/1000 rad, G1=0.075 μm, G2=0.05 μm, and G=0.125 μm.

When the exposure accuracy is on the order of 0.1 μm, the exposure error G=0.125 μm is unpermissible.

Therefore, in order to correct the transfer error G, the controller 16 controls the rotary-X-Y table 9c to shift the wafer 7 by a distance −G as illustrated in FIG. 4. Consequently, the calculated exposure error G in the range of 0.05 to 0.1 μm is reduced to 0.005 μm or less. Such a small exposure error enables the X-ray proximity exposure for printing a LSI pattern having wiring lines of 0.8 μm or less in width.

Although the procedure of exposure error correction has been described as applied to correcting the exposure error in a plane defined by the X-axis and the Z-axis, the exposure error in a plane defined by the Y-axis and the Z-axis can be corrected in the same procedure.

The dislocation of the mask 6 and the wafer 7 along the perpendicular 8 relative to the X-ray source 3 affects the magnification in transferring (exposing) the mask pattern 6a to the wafer 7, and hence the dislocation of the mask 6 and the wafer 7 must be corrected. In correcting the dislocation, the wafer holder 9b is moved along the perpendicular 8 relative to the mask 6 to adjust the distance B between the mask pattern and the surface of the wafer.

When the vibration isolators 11 are controllable pneumatic cushions, the exposure error G can be corrected by controlling the respective air pressures of the vibration isolators 11 by the controller 16. In FIG. 2, indicated at 18 is a pressure correction signal. In this embodiment, response time must be taken into consideration in controlling the air pressure of the vibration isolator 11.

Figure 5:
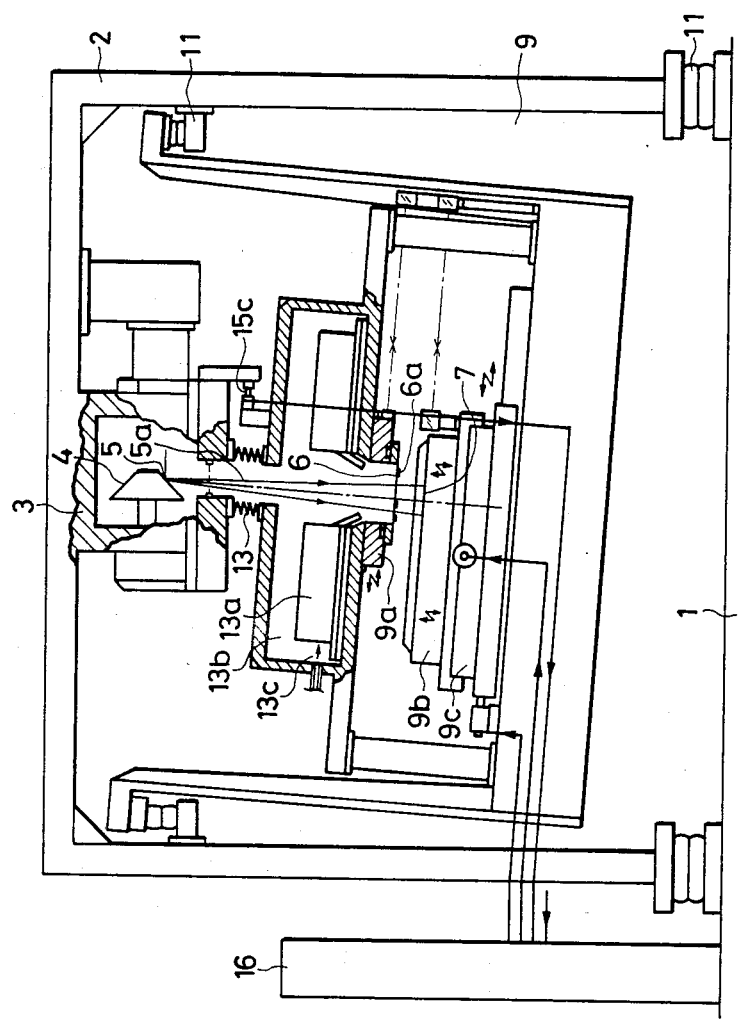
FIG. 5 is a partly sectional front elevation of an X-ray exposure system, in a second embodiment, according to the present invention.

In a second embodiment illustrated in FIG. 5, vibration isolators 11 for a mask-wafer alignment system 10 are disposed on the substantially same level as the X-ray generating point 5 of an X-ray source 3, the error G1 attributable to the inclination θ is eliminated. Accordingly, only the error attributable to the horizontal dislocation needs to be corrected.

On the other hand, the error attributable to the horizontal dislocation can be nullified by constructing the guide mechanism sliding to the vertical direction so that the error attributable to the horizontal dislocation is limited below a permissible value.

Furthermore, vibration isolators 11 for the X-ray source 3 may be disposed on the same level as the X-ray generating point 5. However, in such a case, since the transmission of vibrations from the floor to the mask-wafer alignment system 9 can not be controlled, the floor must be vibration-proof.

Still further, according to the present invention, the exposure error G may be corrected by controlling a controllable stage capable of adjusting the horizontal dislocation, the vertical dislocation and the inclination dislocation with respect to the direction of radiation of X-rays, provided between the base 10 and each vibration isolator 11.

Although the first embodiment described hereinbefore detects the horizontal dislocation X and the inclination of the mask-wafer alignment system 9 relative to the X-ray source 3, and then corrects the exposure error G, naturally, the exposure error G may be corrected on the basis of the results of detection of the dislocation of the mask-wafer alignment system 9 in three-dimensional directions relative to the X-ray source 3.

As obvious from Expressions (1) to (3), according to the present invention, it is also possible to achieve the correction by making the error G1 attributable to the horizontal dislocation X and the error G2 attributable to the inclination θ cancel each other.

FIGS. 6a, 6b and 6c are time charts for the operation of the X-ray exposure system according to the present invention. When the X-ray exposure system is of the step-and-repeat type, the exposure area of the wafer varies due to the step-and-repeat operation of the X-Y table 9c, while the vibration isolators 11 are dislocated by the acceleration and deceleration of the X-Y table 9c. In an exemplary X-ray exposure operation, the horizontal dislocation was 2 mm, the difference between yL and yk was 3.0 mm when L was 1 m. When these values are substituted into Expressions (1) to (5), the exposure error G is 0.14 μm. As shown in FIG. 6b, one X-ray exposure cycle includes the rapid motion of the X-Y table 9c in a section 21, the slow motion of the X-Y table 9c in a section 22, alignment in a section 23, and X-ray exposure in a section 24. The X-ray exposure cycle is repeated necessary times. As indicated by continuous line 27 in FIG. 6a, the exposure error G varies with time as the X-ray exposure opreration is carried on. As apparent from the continuous line 27, since the response of the vibration isolators 11 delays (normally, not more than several Hz), an exposure error of −0.14 μm still remains in the initial stage of the aligning operation in the section 23 after the rotary-X-Y table 9c has been stopped. The exposure error G settles at a fixed value in about 1.5 sec. However, the vibration isolators 11 each has the neutral zone, the exposure error G can not be corrected perfectly, and hence a exposure error G of −0.1 μm remains. As shown in FIG. 6c, when the exposure error G is detected and calculated in a section 28 and the exposure error G is corrected in a section 29 simultaneously with the fine adjustment of the rotary-X-Y table 9c, the exposure error G can be reduced to a value within a range of ±0.005 μm or less.

The time of the section 28 for the detection and calculation of the exposure error G is up to 10 msec; the correction of a dislocation of about 0.1 μm of the rotary-X-Y table 9c is completed within several milliseconds. The response speed of the exposure error correcting operation is in the range of several tens of hertz and several hundreds of hertz, which is sufficiently quick as compared with the motion of the vibration isolators. In some cases, the correcting operation is unnecessary (in the section 28 correspoonding to the section for the rapid motion of the rotary-X-Y table 9c and in a section 32 in which the exposure error G is stabilized).

Although the response speed of the correcting operation is sufficiently high, the vibration isolators 11 are capable of responding to vibrations of a considerably high frequency of about 20 Hz.

Naturally, the exposure error G may be corrected by a correcting means other than the rotary-X-Y table 9c, such as controllable vibration isolators or counterweight. The correction of the exposure error G can easily be achieved through the feedback control of the correcting means.

It is also possible only to detect and calculate the exposure error G and to permit the X-ray exposure operation only when the exposure error G is permissible.

Accelerometers, inclinometers or noncontact type optical (laser) detectors may be employed instead of the ordinary contact type position detectors. Naturally, the position detectors may be attached to the frame 2 holding the X-ray source 3.

As apparent from what has been described hereinbefore, according to the present invention, the mask-wafer alignment system is supported on vibration isolators to isolate the mask-wafer alignment system from vibrations generated by the X-ray source and other external sources of vibration, the dislocation of the mask-wafer alignment system relative to the X-ray source due to supporting the mask-wafer alignment system on vibration isolators is determined by the agency of detecting means and arithmetic means, and thus the dislocation is corrected to reduce the exposure error satisfactorily so that X-ray proximity exposure or X-ray projective exposure is applicable to printing LSI having wiring lines of 0.8 μm or less in width.

Furthermore, according to the present invention, the X-ray path between the X-ray source and the mask-wafer alignment system is enclosed by a flexible hermetic structure, and thereby the attenuation of X-rays is prevented, a highly accurate X-ray exposure operation is achieved, and the throughout of the X-ray exposure process is improved.

What is claimed is:

1. An X-ray exposure system comprising:
    a frame set on a floor;
    X-ray source means for generating X-rays, the X-ray source means being fixedly provided in a central portion of an upper part of the frame;
    a mask-wafer alignment means comprising a wafer holder means for holding a wafer at a fixed distance from a mask having an exposure pattern, X-Y table means for mounting the wafer holder, a mask holder for holding the mask, and an alignment detecting means for detecting the alignment of an alignment pattern of the mask and that of the wafer;
    a supporting base fixedly mounted to and supporting the mask-wafer alignment means;
    vibration isolator means for supporting the mask-wafer alignment means so that vibration does not propagate to the mask-wafer alignment means;
    detecting means for detecting the three dimensional position of the mask-wafer alignment means relative to the X-ray source means;
    an arithmetic means for calculating the dislocation of the mask exposure pattern projected on the wafer from the correct position thereof, on the basis of position data obtained by the detecting means; and
    correcting means for correcting for said dislocation as calculated by the arithmetic means.

2. An X-ray exposure system according to claim 1; wherein said vibration isolator means are set on the floor.

3. An X-ray exposure system according to claim 1; wherein said vibration isolator means are mounted on said frame on substantially the same height position as the X-ray generating point of the X-ray source means.

4. An X-ray exposure system according to claim 1; wherein said correcting means adjusts the respective positions of the mask and the wafer minutely respective to each other on the basis of the dislocation calculated by said arithmetic means.

5. An X-ray exposure system according to claim 4; wherein said correcting means moves the wafer holder minutely relative to the mask for positional adjustment.

6. An X-ray exposure system according to claim 4 or 5;
    wherein said correcting means includes a relative displacement measuring means for measuring the relative displacement between the mask and the wafer.

7. An X-ray exposure system according to claim 1;
    wherein a sealed chamber hermetically containing He-gas or the like for mitigating the attenuation of X-rays between the X-ray source means and the mask is formed on said mask holder, and the upper end of the sealed chamber and the X-ray source are interconnected by a flexible structure such as a bellows.

8. An X-ray exposure system according to claim 1; wherein said vibration isolator means are controllable pneumatic springs.

9. An X-ray exposure system according to claim 1, wherein the vibration isolator means includes controllable pneumatic springs.

10. An X-ray exposure system according to claim 1; wherein said alignment detecting means comprises an optical system.

11. An X-ray exposure system comprising:
    mask-wafer alignment means including a wafer holder for holding a wafer, a mask holder for holding a mask having an exposure pattern, alignment detecting means for detecting a relative displacement between an alignment pattern of the mask and an alignment pattern of the wafer, and alignment means for aligning the wafer and the mask by moving at least one of the wafer holder and the mask holder in accordance with the relative displacement detected by the alignment detecting means;
    a supporting base fixedly mounted to and supporting the mask-wafer alignment means;
    vibration isolator means for supporting the supporting base to that vibration does not propagate to the mask-wafer alignment means;
    a frame set on a floor;
    X-ray source means for generating X-rays, said X-ray source means being fixedly provided on the frame so that an X-ray generated from the X-ray source means is irradiated toward the mask and the wafer;
    detecting means for detecting the three dimensional position of the mask-wafer alignment means with respect to the X-ray source means; and
    correcting means for correcting for dislocation of the projection of the said exposure pattern on the wafer on the basis of position data detected by the detecting means.

12. An X-ray exposure system according to claim 11, wherein the vibration isolator means are mounted on the floor.

13. An X-ray exposure system according to claim 11, wherein the vibration isolator means are mounted on the frame at substantially the same height position as the X-ray generating point of the X-ray source means.

14. An X-ray exposure system according to claim 13, wherein the correcting means moves the wafer holder minutely relative to the mask for positional adjustment.

15. An X-ray exposure system according to claim 11, wherein said correcting means includes arithmetic means for calculating the dislocation of said exposure pattern on the basis of the position data.

16. An X-ray exposure system according to claim 15, wherein the correcting means adjusts the respective positions of the mask and the wafer minutely relative to each other on the basis of the dislocation of the projection of said exposure pattern on the wafer.

17. An X-ray exposure system according to claim 15, wherein the correcting means includes relative displacement measuring means for measuring the relative displacement between the mask and the wafer.

18. An X-ray exposure system according to claim 11, further comprising a sealed chamber hermetically containing a component for mitigating the attenuation of X-rays between the X-ray source means and the mask, and flexible means for interconnecting a portion of the sealed chamber and the X-ray source means.

19. An X-ray exposure system according to claim 11, wherein the alignment detecting means includes an optical system.

20. An X-ray exposure system according to claim 11, wherein the vibration isolator means includes means for supporting the frame on the floor.

21. An X-ray exposure system according to claim 11, wherein the mask-wafer alignment means includes regulating means for maintaining a predetermined distance between the mask and wafer.

22. An X-ray exposure system according to claim 11, wherein the detecting means includes a plurality of position detectors for detecting a displacement substantially perpendicular to the X-ray irradiating direction and a displacement along the X-ray irradiating direction.

23. An X-ray exposure system according to claim 11, wherein the correcting means includes a controllable stage means for adjusting at least dislocation substantially perpendicular to the X-ray irradiating direction between the supporting base and the vibration isolator means.

24. An X-ray exposure system according to claim 11, wherein the correcting means includes means for adjusting the X-ray source means in a direction substantially perpendicular to the X-ray irradiating direction.

25. An X-ray exposure system according to claim 11, wherein the correcting means includes means for adjusting controllable vibration isolators.

* * * * *